US008067831B2

(12) United States Patent
Kwon et al.

(10) Patent No.: US 8,067,831 B2
(45) Date of Patent: Nov. 29, 2011

(54) INTEGRATED CIRCUIT PACKAGE SYSTEM WITH PLANAR INTERCONNECTS

(75) Inventors: Hyeog Chan Kwon, Seoul (KR); Tae Sung Jeong, Kyoungki-do (KR); Jae Han Chung, Kyoungki-do (KR); Taeg Ki Lim, Cheongju-si (KR); Jong Wook Ju, Kyoungki-do (KR)

(73) Assignee: Stats Chippac Ltd., Singapore (SG)

( * ) Notice: Subject to any disclaimer, the term of this patent is extended or adjusted under 35 U.S.C. 154(b) by 76 days.

(21) Appl. No.: 11/162,629

(22) Filed: Sep. 16, 2005

(65) Prior Publication Data

US 2007/0063331 A1 Mar. 22, 2007

(51) Int. Cl.
*H01L 23/48* (2006.01)

(52) U.S. Cl. ........ 257/695; 257/666; 257/686; 257/693; 257/777; 257/E23.011; 257/E23.031; 438/109; 438/112

(58) Field of Classification Search .................. 257/666, 257/E23.114, 686, 693, 695, 777, E23.011, 257/E23.031; 438/109, 112

See application file for complete search history.

(56) References Cited

U.S. PATENT DOCUMENTS

| | | | | |
|---|---|---|---|---|
| 5,519,936 | A * | 5/1996 | Andros et al. | 29/840 |
| 5,668,405 | A * | 9/1997 | Yamashita | 257/668 |
| 6,150,193 | A * | 11/2000 | Glenn | 438/113 |
| 6,239,496 | B1 * | 5/2001 | Asada | 257/777 |
| 6,281,437 | B1 * | 8/2001 | Anderson et al. | 174/541 |
| 6,335,565 | B1 * | 1/2002 | Miyamoto et al. | 257/686 |
| 6,448,506 | B1 * | 9/2002 | Glenn et al. | 174/260 |
| 6,451,626 | B1 * | 9/2002 | Lin | 438/108 |
| 6,762,117 | B2 | 7/2004 | Lam et al. | 438/612 |
| 6,787,901 | B2 | 9/2004 | Reyes et al. | 257/724 |
| 6,794,760 | B1 | 9/2004 | Jaeck et al. | 257/784 |
| 6,822,316 | B1 | 11/2004 | Hsuan | 257/621 |
| 6,838,310 | B1 | 1/2005 | Hsuan | 438/106 |
| 6,891,273 | B2 | 5/2005 | Pu et al. | |
| 6,946,325 | B2 * | 9/2005 | Yean et al. | 438/112 |
| 6,982,491 | B1 * | 1/2006 | Fan et al. | 257/778 |
| 7,262,497 | B2 * | 8/2007 | Fang | 257/701 |
| 2005/0006745 | A1 * | 1/2005 | Nishimura | 257/686 |
| 2005/0029642 | A1 * | 2/2005 | Takaya et al. | 257/678 |
| 2005/0051859 | A1 * | 3/2005 | Hoffman | 257/434 |

* cited by examiner

*Primary Examiner* — Wael Fahmy
*Assistant Examiner* — John C Ingham
(74) *Attorney, Agent, or Firm* — Mikio Ishimaru

(57) ABSTRACT

An integrated circuit package system is provided including forming a first substrate, mounting a first integrated circuit to the first substrate, and forming first planar interconnects in contact with the first integrated circuit and electrically connecting the first integrated circuit to the first substrate.

20 Claims, 5 Drawing Sheets

100 120 112 102 112 110 118 116 114 114 104 106 108 122

INTEGRATED CIRCUIT PACKAGE SYSTEM WITH PLANAR INTERCONNECTS

TECHNICAL FIELD

The present invention relates generally to integrated circuit package systems, and more particularly to a system for an integrated circuit package with planar interconnects.

BACKGROUND ART

Currently, the predominant ways for electrically connecting semiconductor devices to substrates are through wire bonding and through solder bumps as in flip chip packages. Wire bonding while being straightforward has the limitation of low hourly based unit manufacturability. Loop like wire structures form resulting in wire sweep problems during molding. Also, spacing requirements and the overall package height increase for the die stack. With the ever increasing demand for small, light weight personal electronics devices like cellular phones, PDA's, audio entertainment devices and mobile games, the ability to reduce the thickness and price of electronic packaging is essential.

Thus, a need still remains for a highly reliable and high volume manufacturing solution for integrated circuit packaging. In view of the ever-increasing need to save cost and improve efficiencies, it is increasingly critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a first substrate, mounting a first integrated circuit to the first substrate, and forming first planar interconnects in contact with the first integrated circuit and electrically connecting the first integrated circuit to the first substrate.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The current invention proposes a packaging system that utilizes currently available techniques such as conductive material deposition through a mask process, photolithography, a stencil printing process or like process to make the electrical interconnects which are planar as opposed the loops caused by wire bonding. Thus, the "planar interconnects", the equivalent of bond wires, are flat on top and bottom between horizontal ends, which are connected to contacts on an integrated circuit die and a package substrate. Likewise, the drawings showing embodiments of the apparatus are semi-diagrammatic and not to scale and, particularly, some of the dimensions are for the clarity of presentation and are shown greatly exaggerated in the figures. Generally, the device can be operated in any orientation. The same numbers are used in all the figures to relate to the same elements.

The term "horizontal" as used herein is defined as a plane parallel to the conventional plane or surface of the integrated circuit package, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Figure 1:
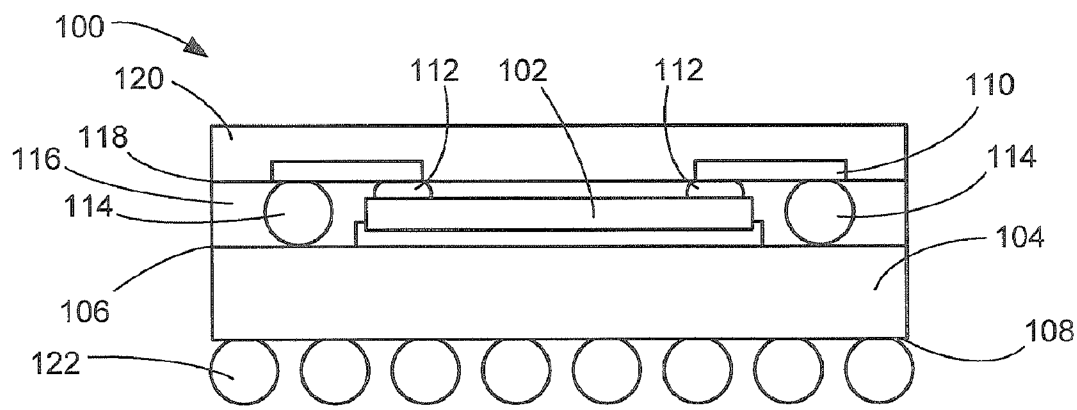
FIG. 1 is a cross-sectional view of an integrated circuit package with planar interconnects system in an embodiment of the present invention.

Referring now to FIG. 1, therein is shown a cross-sectional view of an integrated package with planar interconnects system 100 in an embodiment of the present invention. The integrated circuit package with planar interconnects system 100 includes a first integrated circuit 102, mounted completely above a first substrate 104, comprising a top surface 106 and a bottom surface 108, and first planar interconnects 110.

The first planar interconnects 110 are defined by being the electrical equivalent of bond wires that are flat on top and bottom between horizontal ends. One set of the horizontal ends are mechanically and electrically connected over the top of the first integrated circuit 102 and the other set of ends are electrically connected to the top surface 106 of the first substrate 104 by first interconnect structures 114. The first integrated circuit 102, vertically located between the first planar interconnects 110 and the first substrate 104, includes first solder bumps 112 providing electrical contact sites for the first planar interconnects 110. The first interconnect structures 114 provide electrical connections between the first planar interconnects 110 and the top surface 106, wherein the first interconnect structures 114 attach to the top surface 106 of the first substrate 104.

For illustrative purposes, the first interconnect structures 114 are shown as solder balls, although, it is understood the electrical connections may be provided by other electrical interconnect structures, such as conductive posts, conductive balls, conductive stud bumps or conductive interposers. These interconnect structures are typically made of gold, silver, copper or zinc, but could include other conductive materials.

A first encapsulant layer 116 encases the first integrated circuit 102 and the first interconnect structures 114 to the top surface 106. A chemical-mechanical planarization process applied to the first encapsulant layer 116 results in a first polished surface 118 on top of the first encapsulant layer 116, wherein the first polished surface 118 has exposed the first solder bumps 112 and the first interconnect structures 114 for electrical connection. The first planar interconnects 110 are deposited on the first polished surface 118 of the first encapsulant layer 116 to electrically connect the first integrated circuit 102 second interconnect structures 122, on the bottom surface 108 of the first substrate 104, through the first solder bumps 112, and the first interconnect structures 114, and the first substrate 104. The first planar interconnects 110 only contact or touch the first encapsulant layer 116 on a bottom side of the first planar interconnects 110.

A second encapsulant layer 120, encases the first planar interconnects 110 and the first polished surface 118 of the first encapsulant layer 116, wherein the second encapsulant layer 120 protects the first integrated circuits 102 and the first planar interconnects 110. The second interconnect structures 122 mechanically and electrically connect to the bottom surface 108 of the first substrate 104. The second interconnect structures 122 may be evenly spaced across the bottom surface 108 of the first substrate 104 including directly below the first integrated circuit 102.

For illustrative purposes the second interconnect structures 122 are shown as solder balls, although it is understood that the second interconnect structures 122 may be other structures such as conductive posts, conductive pads or pins.

Figure 2:
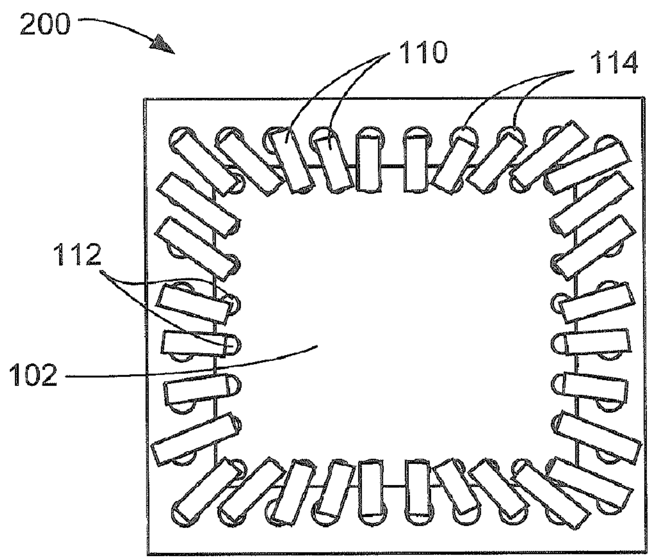
FIG. 2 is a top view of the integrated circuit package with planar interconnects system shown in FIG. 1.

Referring now to FIG. 2, therein is shown a top view 200 of the integrated package with the planar interconnects system 100 shown in FIG. 1. The top view 200 shows straight line electrical connections of the first planar interconnects 110 that electrically connect the first solder bumps 112 to the first interconnect structures 114 shown in FIG. 1. This technique allows a higher density of interconnects to reside in the periphery of the integrated circuit than is allowed by a wire bonding process. The first planar interconnects 110 are easier to manufacture and have a higher reliability of assembly than wire bonds.

Figure 3:
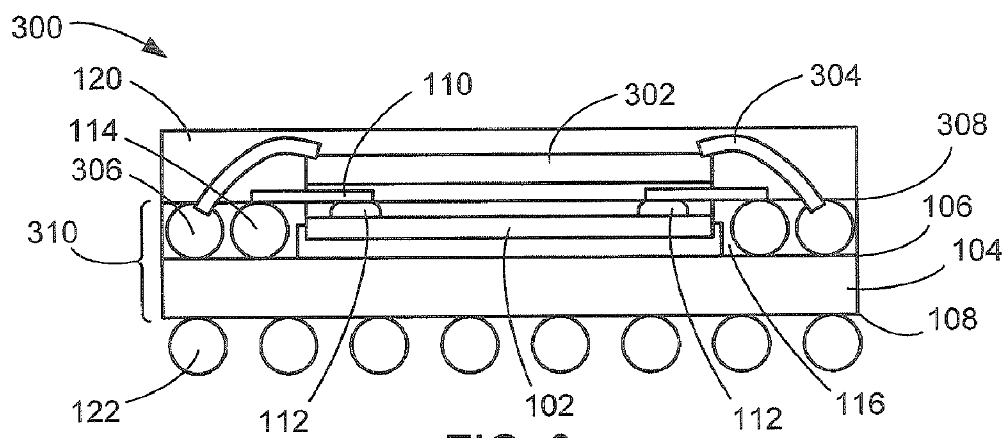
FIG. 3 is a cross-sectional view of an integrated package with planar interconnects system, in an alternate embodiment of the present invention.

Referring now to FIG. 3, therein is shown a cross-sectional view of an integrated package with planar interconnects system 300 in an alternate embodiment of the present invention. The system 300 with wire bonds includes a second integrated circuit 302 mounted on a first substrate assembly 310. The first substrate assembly 310 includes the first integrated circuit 102, the first substrate 104, having the top surface 106 and the bottom surface 108, the first planar interconnects 110, the first interconnect structures 114, and the first encapsulant layer 116, as shown and described in FIG. 1 above. Additionally, third interconnect structures 306 are provided in the first encapsulant layer 116. A first polished surface 308 exposes the third interconnect structures 306 for electrical connection.

The second integrated circuit 302 is electrically connected to the first substrate assembly 310 with first wire bonds 304, wherein the first wire bonds 304 electrically connect the second integrated circuit 302 and the top surface 106. The third interconnect structures 306 provide the electrical connections between the first wire bonds 304 and the top surface 106. For illustrative purposes, the third interconnect structures 306 are shown as solder balls, although it is understood that the electrical connections may be provided by other electrical interconnect structures such as conductive posts, conductive balls, conductive stud bumps or conductive interposers.

The second encapsulant layer 120 encases the second integrated circuit 302, the first wire bonds 304 and the first substrate assembly 310. The second interconnect structures 122 mechanically and electrically connects to the bottom surface 108.

Figure 4:
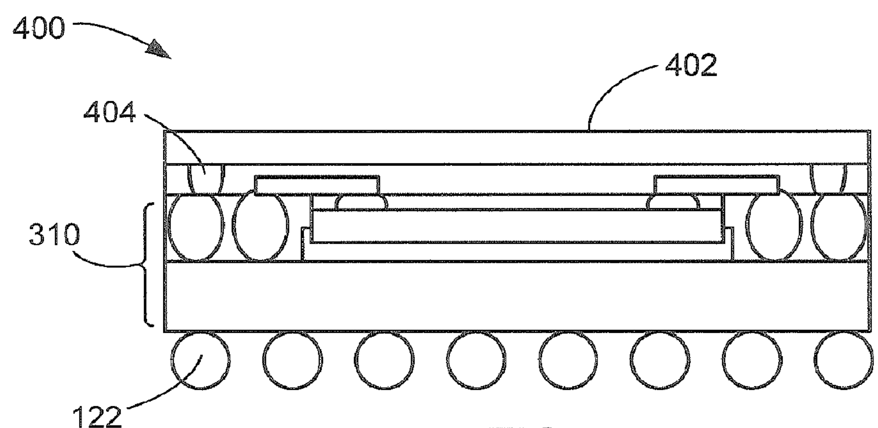
FIG. 4 is a cross-sectional view of an integrated package with planar interconnects system, in yet another embodiment of the present invention.

Referring now to FIG. 4, therein is shown a cross-sectional view of an integrated package with planar interconnects system 400, in yet another embodiment of the present invention. The integrated package with planar interconnects system 400 includes the first substrate assembly 310 and a second integrated circuit 402, flip chip mounted to the first substrate assembly 310, having second solder bumps 404 mechanically and electrically connecting the second integrated circuit 402 to first substrate assembly 310.

The second interconnect structures 122 mechanically and electrically connects to the first substrate assembly 310. For illustrative purposes, FIG. 4 does not show the second encapsulant layer 120 encasing the second integrated circuit 402, although it is understood the second encapsulant layer 120 may encapsulate the second integrated circuit 402 and the first substrate assembly 310.

Figure 5:
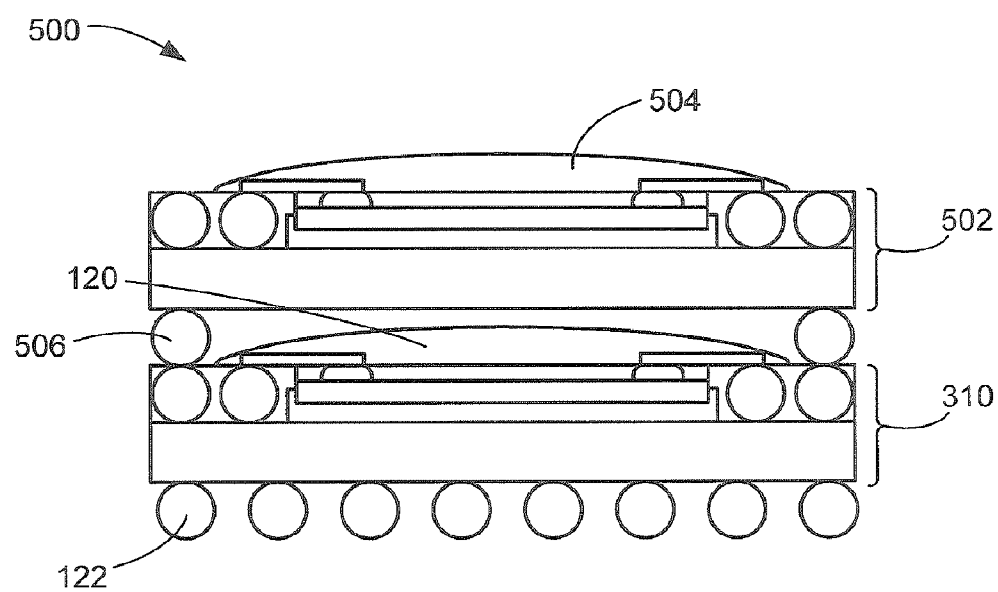
FIG. 5 is a cross-sectional view of an integrated package with planar interconnects system, in yet another embodiment of the present invention.

Referring now to FIG. 5, therein is shown a cross-sectional view of an integrated package with planar interconnects system 500, in yet another embodiment of the present invention. The integrated package with planar interconnects system 500 includes two of the first substrate assembly 310 of FIG. 3 as described above that are vertically stacked and electrically connected to each other, wherein a second substrate assembly 502 comprises the first substrate assembly 310 as described above.

The second interconnect structures 122 mechanically and electrically connect to the first substrate assembly 310. A second interconnect structures 506 electrically connect the first substrate assembly 310 and the second substrate assembly 502. The second encapsulant layer 120 encases the first substrate assembly 310 and a second encapsulant layer 504 encases the second substrate assembly 502.

Figure 6:
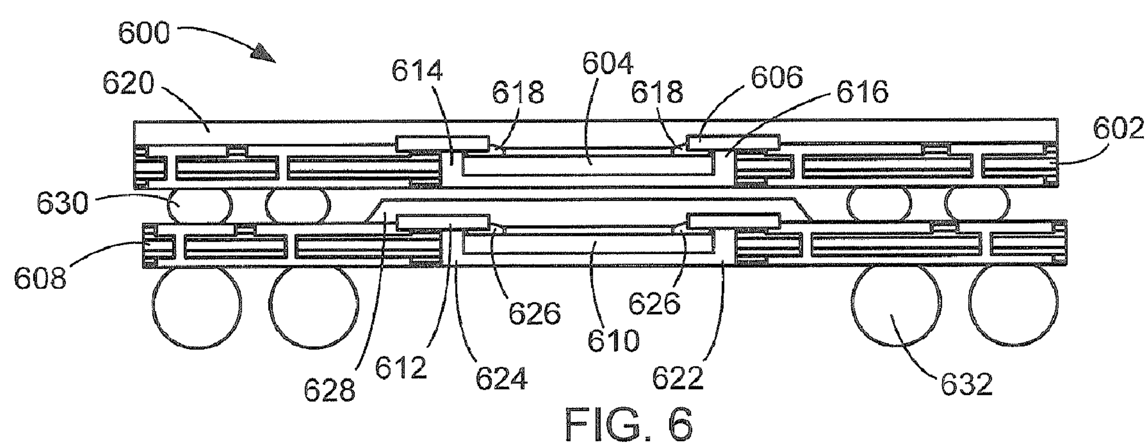
FIG. 6 is a cross-sectional view of an integrated circuit package with planar interconnects system, in yet another embodiment of the present invention.

Referring now to FIG. 6, therein is shown a cross-sectional view of an integrated circuit package with planar interconnects system 600, in yet another embodiment of the present invention. The system 600 is a dual substrate flush mount package including a first substrate 602, a first integrated circuit 604, and first planar interconnects 606. The system 600 further includes a second substrate 608, a second integrated circuit 610, and second planar interconnects 612.

The first substrate 602 includes a first recess 614 providing clearance for the first integrated circuit 604. The first integrated circuit 604 is encased in the first recess 614 by a first encapsulation layer 616. The first integrated circuit 604 includes first solder bumps 618 providing electrical contact sites for the first planar interconnects 606. The first planar interconnects 606 electrically connect the first solder bumps 618 to the first substrate 602.

The first planar interconnects 606 connects flush to the first solder bumps 618 and to the first substrate 602. A second encapsulation layer 620 encases and protects the first substrate 602, the first integrated circuit 604, and the first planar interconnects 606.

The second substrate 608 includes a second recess 622 providing clearance for the second integrated circuit 610. The second integrated circuit 610 is encased in the second recess 622 by a third encapsulation layer 624. The second integrated circuit 610 includes second solder bumps 626 providing electrical contact sites for the second planar interconnects 612.

The second planar interconnects 612 electrically connect the second solder bumps 626 to the second substrate 608. The second planar interconnects 612 connect flush to the second solder bumps 626 and to the second substrate 608. The second integrated circuit 610 and the second planar interconnects 612 are encased by a third encapsulant layer 628 to protect the second integrated circuit 610 and the second planar interconnects 612.

A first ball grid array interface 630 connects the first substrate 602 and the second substrate 608. A second ball grid array interface 632 connects the second substrate 608 to an external printed circuit board (not shown).

Figure 7:
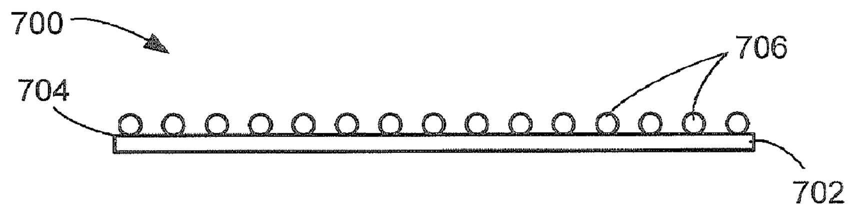
FIG. 7 is a cross-sectional view of a first wafer, in a wafer bump phase.

Referring now to FIG. 7, therein is shown a cross-sectional view of a first wafer 702, in a wafer bump phase. Wherein first solder bumps 706 are mechanically and electrically attached to a top surface 704.

Figure 8:
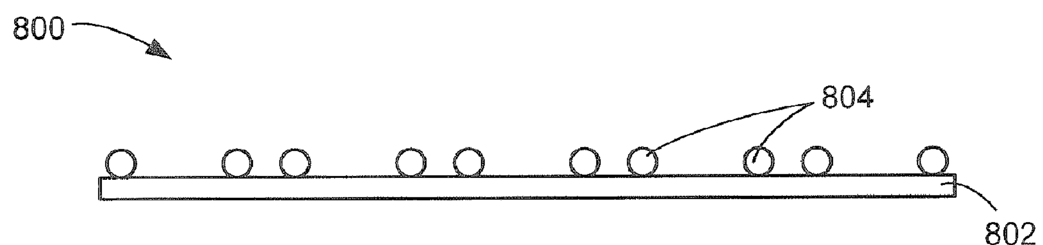
FIG. 8 is a cross-sectional view of the first substrate, in an interconnect structure attach phase.

Referring now to FIG. 8, therein is shown a cross-sectional view of the first substrate 802, in an interconnect structure attach phase. Wherein first interconnect structures 804, such as conductive posts, conductive balls, conductive stud bumps or conductive interposers are attached to the first substrate 802.

Figure 9:
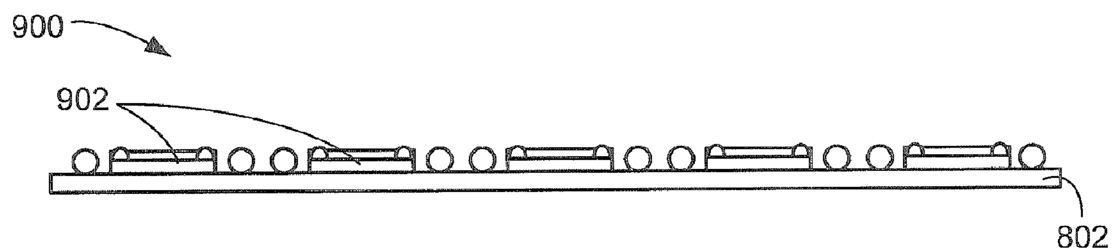
FIG. 9 is a cross-sectional view of the first substrate of FIG. 8, in a die attach phase.

Referring now to FIG. 9, therein is shown a cross-sectional view of the first substrate 802 of FIG. 8, in a die attach phase. Wherein first integrated circuits 902 are mechanically mounted on the first substrate 802.

Figure 10:
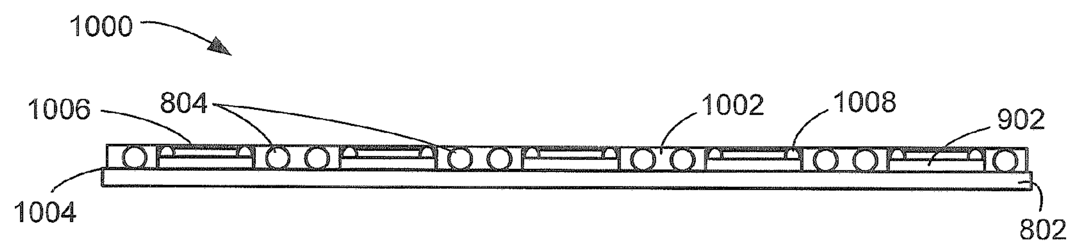
FIG. 10 is a cross-sectional view of an encapsulation phase of the first substrate.

Referring now to FIG. 10, therein is shown a cross-sectional view of an encapsulation phase of the first substrate 802. The first substrate 802 having the first integrated circuits 902 of FIG. 9 thereon. A first encapsulant layer 1002 encases the first integrated circuits 902, the first interconnect structures 804 and a top surface 1004 of the first substrate 802. A chemical-mechanical planarization process applied to the first encapsulant layer 1002 resulting in a first polished surface 1006 exposing the first interconnect structures 804 and first solder bumps 1008 for electrical connection.

Figure 11:
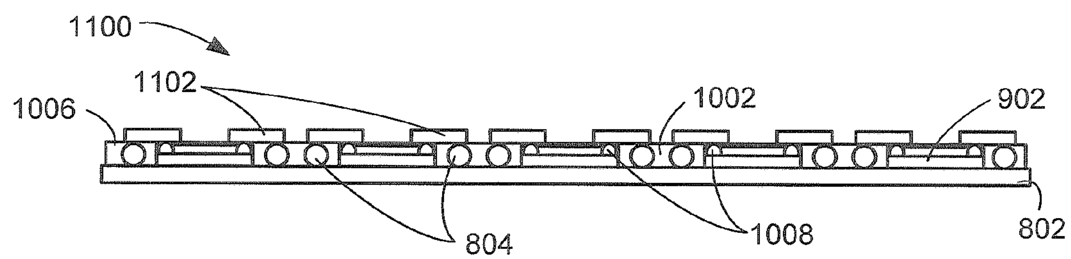
FIG. 11 is a cross-sectional view of the first substrate of FIG. 10 in the deposition phase.

Referring now to FIG. 11, therein is shown a cross-sectional view of the first substrate 802 of FIG. 10 in the deposition phase. The first polished surface 1006, having first planar interconnects 1102 thereon, electrically connecting the first interconnect structures 804 and the first solder bumps 1008.

Figure 12:
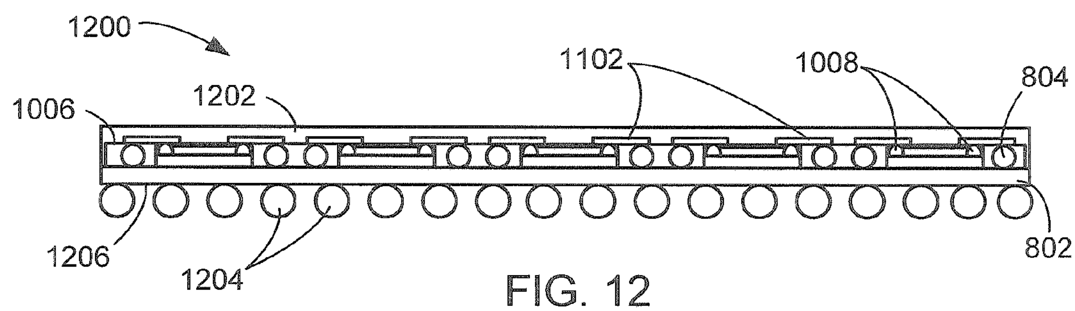
FIG. 12 is a cross-sectional view of the first substrate of FIG. 11 in the second encapsulation phase.

Referring now to FIG. 12, therein is shown a cross-sectional view of the first substrate 802 of FIG. 11 in the second encapsulation phase. The first substrate 802 having a second encapsulant layer 1202. The second encapsulant layer 1202 encases the first planar interconnects 1102 and the first polished surface 1006. Second interconnect structures 1204 are mechanically and electrically attached to a bottom surface 1206 of the first substrate 802.

Generally, an integrated circuit package system is provided including forming a first substrate, mounting a first integrated circuit to the first substrate, and forming first planar interconnects in contact with the first integrated circuit and electrically connecting the first integrated circuit to the first substrate.

Figure 13:
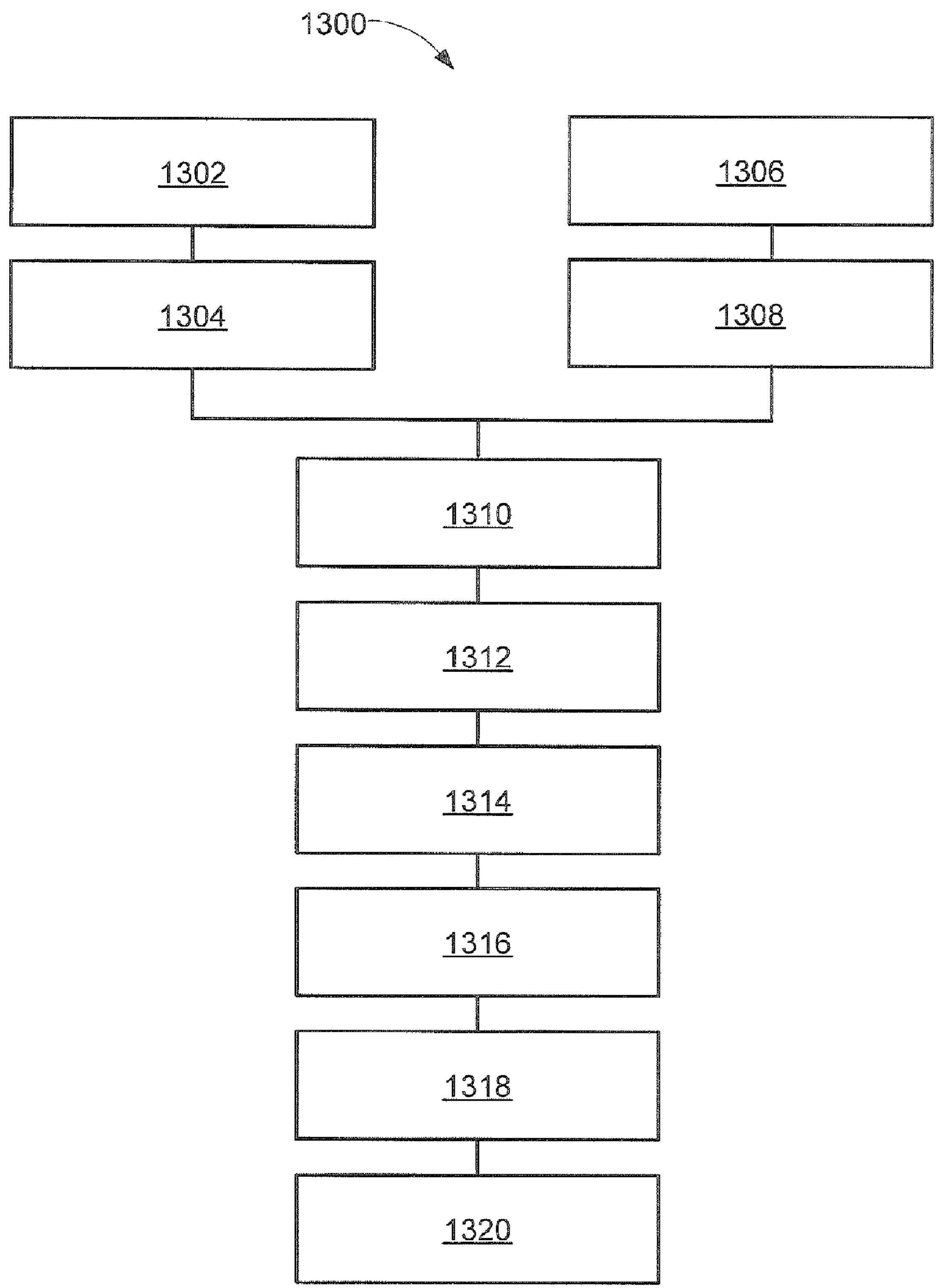
FIG. 13 is a flow chart of the system for the integrated circuit package with planar interconnects system in an embodiment of the present invention.

Referring now to FIG. 13, therein is shown a flow chart of an integrated circuit package system 1300 in an embodiment of the present invention. The system 1300 includes providing a first wafer bump process phase wherein first solder bumps is applied to the first wafer in a block 1302; providing a wafer dicing step wherein the first wafer is diced in a block 1304; providing a substrate fabrication phase, wherein a first substrate is fabricated in a block 1306; providing an interconnect structure attach phase, wherein first interconnect structures are mechanically and electrically attached to the first substrate in a block 1308; providing an integrated circuit attach phase, wherein first integrated circuits are mechanically attached to the first substrate in a block 1310; providing a first encapsulation phase, wherein the first integrated circuits, the first interconnect structures and the top surface of the first substrate are encased by a first encapsulant layer in a block 1312; providing a CMP phase, wherein the first substrate is subjected to a chemical-mechanical planarization process to expose the first interconnect structures, the first solder bumps and creating the first polished surface in a block 1314; providing a deposition phase, wherein first planar interconnects electrically connect the first interconnect structures with the first solder bumps in a block 1316; providing a second encapsulation phase, wherein a second encapsulant layer encases the first planar interconnects and the first polished surface in a block 1318; and providing an external mounting attach phase, wherein second interconnect structures is mechanically and electrically attached to the bottom surface of the first substrate in a block 1320.

In greater detail, a method to assemble the integrated circuit package with planar interconnects system 100 utilizing a planar interconnect process according to an embodiment of the present invention, is performed as follows:

1. Starting with the first wafer 702, the first solder bumps 706 are electrically attached thereto. (FIG. 7)

2. The first substrate 802 is fabricated and the first interconnect structures 804 are mechanically and electrically attached thereto. (FIG. 8)

3. After the first wafer 702 is diced, a die-attach process is used to mechanically attach the first integrated circuits 902 to the first substrate 802. (FIG. 9)

4. The first encapsulant layer 1002 is applied to encase the first substrate 802 and is subjected to a CMP process to establish the first polished surface 1006 with electrical contacts exposed, wherein the first planar interconnects 1102 are deposited on the first polished surface 1006, electrically connecting the integrated circuits 902 to the first substrate 802 (FIG. 11)

5. The second encapsulant layer 1202 encases the first planar interconnects 1102 and the second interconnect structures 1204 is attached to the bottom surface 1206 of the first substrate 802. (FIG. 12)

It has been discovered that the present invention thus has numerous advantages.

An advantage is that the present invention allows is higher density of I/O interconnects around the periphery of an integrated circuit due to the fact that the planar interconnects do not move or deflect during the final encapsulation process, as wire bonding does. The first planar interconnects are easier to manufacture, have a higher reliability of assembly and allows a higher density of interconnects, to reside in the periphery of the integrated circuit, than is allowed by the wire bonding process. This also results in a more reliable packaging process because the planar interconnects do not short together or break as wire bonds do.

Another advantage is that the use of planar interconnects will reduce the time required to produce a package. Wire bonding is done on one interconnect at a time while planar interconnects are all done at one time. This will increase the volume of packages produced as well as increasing the yield of finished packages. The result is a smaller and less costly packaging system.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the Integrated circuit package with planar interconnects system method and apparatus of the present invention furnish important and heretofore unknown and unavailable solutions, capabilities, and functional advantages for high density package manufacture. The resulting processes and configurations are straightforward, cost-effective, uncomplicated, highly versatile and effective, can be implemented by adapting known technologies, and are thus readily suited for efficiently and economically manufacturing low profile integrated circuit packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An integrated circuit packaging method comprising:

forming a first substrate having second interconnect structures on a bottom surface including the second interconnect structures evenly spaced across the bottom surface;

mounting a first integrated circuit directly above the second interconnect structures and completely above the first substrate opposite the second interconnect structures;

molding a first encapsulant layer encasing the first integrated circuit and the first substrate; and forming first planar interconnects, on the first encapsulant layer with only a bottom surface of the first planar interconnects in contact with the first encapsulant layer, for depositing an electrical connection between the first integrated circuit and the second interconnect structures of the first substrate.

2. The method as claimed in claim 1 further comprising forming a first polished surface on the first encapsulant layer exposing first solder bumps on the first integrated circuit and first interconnect structures on the first substrate.

3. The method as claimed in claim 1 wherein the forming of the first planar interconnects further comprises forming a conductive material deposition using a mask process, a photolithography process, or a stencil printing process.

4. The method as claimed in claim 1 wherein forming the first planar interconnects further comprises forming first interconnect structures, wherein each of the first interconnect structures comprises forming a conductive post, a conductive ball, a conductive stud bump or a conductive interposer.

5. The method as claimed in claim 1 further comprising forming a second encapsulant layer encasing the first encapsulant layer and the first planar interconnects.

6. An integrated circuit package method comprising:

forming a first substrate having second interconnect structures on a bottom surface and first interconnect structures connected on the side opposite the second interconnect structures including the second interconnect structures evenly spaced across the bottom surface;

providing a first integrated circuit;

mounting the first integrated circuit directly above the second interconnect structures and completely above the first substrate, with first interconnect structures thereon, further comprising forming a first encapsulant layer to encase the first integrated circuit, the first interconnect structures, and a top surface of the first substrate;

forming first planar interconnects on the first encapsulant layer with only a bottom surface of the first planar interconnects in contact with the first encapsulant layer for depositing an electrical connection at one set of horizontal ends over a top of the first integrated circuit and for electrical connection at the other set of horizontal ends to the first interconnect structures; and forming a second encapsulant layer to encase the first encapsulant layer and the first planar interconnects.

7. The method as claimed in claim 6 wherein the forming of the first planar interconnects further comprises forming a conductive material deposition using a mask process, a photolithography process or a stencil printing process in electrical contact with the first interconnect structures.

8. The method as claimed in claim 6 wherein:

forming the first substrate having first interconnect structures connected thereon further comprises forming a conductive post, a conductive ball, a conductive stud bump or a conductive interposer; and forming the first planar interconnects forms the first planar interconnects electrically in contact with the first interconnect structures.

9. An integrated circuit package system comprising:

a first substrate with second interconnect structures on a bottom surface including the second interconnect structures evenly spaced to cover the bottom surface;

a first integrated circuit mounted directly above the second interconnect structures and completely above the first substrate opposite the second interconnect structures;

a first encapsulant layer encasing the first integrated circuit and the first substrate; and first planar interconnects formed on the first encapsulant layer with only a bottom surface of the first planar interconnects in contact with the first encapsulant layer, wherein the first planar interconnects electrically connect the first integrated circuit and the second interconnect structures of the first substrate.

10. The system as claimed in claim 9 further comprising:

a second integrated circuit mounted over the first integrated circuit;

and wherein:

the second integrated circuit is electrically connected to the first substrate.

11. The system as claimed in claim 10 wherein the second integrated circuit is electrically connected to the first substrate by first bond wires.

12. The system as claimed in claim 10 wherein the second integrated circuit is electrically connected to the first substrate by second solder bumps.

13. The system as claimed in claim 10 further comprising:

a second substrate having the second integrated circuit thereon; and second planar interconnects electrically connecting the second integrated circuit to the second substrate and electrically connecting the second substrate to the first substrate.

14. The system as claimed in claim 9 wherein the first planar interconnects are mounted, flush, between the first integrated circuit and a top surface of first interconnect structures.

15. An integrated circuit package system comprising:

a first substrate having second interconnect structures on a bottom surface and first interconnect structures on the opposite side includes the second interconnect structures spaced evenly across the bottom surface;

a first integrated circuit wherein the first integrated circuit is mounted directly above the second interconnect structures and completely above the first substrate with the first interconnect structures;

a first encapsulant layer encases the first integrated circuit, the first interconnect structures and a top surface of the first substrate;

first planar interconnect, deposited on the first encapsulant layer with only a bottom surface of the first planar interconnects in contact with the first encapsulant layer, electrically connected at one set of horizontal ends deposited over a top of the first integrated circuit and at the other set of horizontal ends to the first substrate; and a second encapsulant layer encasing the first encapsulant layer and the first planar interconnects.

16. The system as claimed in claim 15 wherein each of the first interconnect structures comprises a conductive post, a conductive ball, a conductive stud bump or a conductive interposer.

17. The system as claimed in claim 15 further comprising:

a second integrated circuit mounted over the first integrated circuit; and first wire bonds electrically connecting the second integrated circuit to the first substrate.

18. The system as claimed in claim 15 further comprising:

a second integrated circuit mounted over the first integrated circuit; and second solder bumps electrically connecting the second integrated circuit to the first substrate.

19. The system as claimed in claim 15 further comprising:

a second substrate having a second integrated circuit thereon and mounted on the first substrate; and second planar interconnects electrically connecting the second integrated circuit to the second substrate.

20. The system as claimed in claim 15 further comprising:

a second substrate having a second integrated circuit flush thereon;

second planar interconnects electrically connecting the second integrated circuit to the second substrate and electrically connecting the first substrate to the second substrate.

* * * * *

UNITED STATES PATENT AND TRADEMARK OFFICE

CERTIFICATE OF CORRECTION

PATENT NO. : 8,067,831 B2
APPLICATION NO. : 11/162629
DATED : November 29, 2011
INVENTOR(S) : Kwon et al.

It is certified that error appears in the above-identified patent and that said Letters Patent is hereby corrected as shown below:

In the Specification:

Column 3, line 27, delete "102 second" and insert therefor --102 and second--

Column 3, line 29, delete "112, and the" and insert therefor --112, the--

Signed and Sealed this
Tenth Day of May, 2016

Michelle K. Lee
*Director of the United States Patent and Trademark Office*